(12) United States Patent
Tokuhisa

(10) Patent No.: US 8,542,436 B2
(45) Date of Patent: Sep. 24, 2013

(54) OPTICAL FIBER AMPLIFIER, LIGHT SOURCE DEVICE, EXPOSURE DEVICE, OBJECT INSPECTION DEVICE, AND TREATMENT DEVICE

(75) Inventor: Akira Tokuhisa, Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 13/487,843

(22) Filed: Jun. 4, 2012

(65) Prior Publication Data

US 2012/0242983 A1 Sep. 27, 2012

Related U.S. Application Data

(63) Continuation of application No. 12/320,055, filed on Jan. 15, 2009, now abandoned, which is a continuation of application No. PCT/JP2007/063384, filed on Jul. 4, 2007.

(30) Foreign Application Priority Data

Jul. 20, 2006 (JP) ................................ 2006-197547

(51) Int. Cl.
*H01S 3/00* (2006.01)

(52) U.S. Cl.
USPC ........................................................ 359/341.1

(58) Field of Classification Search
USPC ......................................... 359/341.1; 398/68
See application file for complete search history.

(56) References Cited

U.S. PATENT DOCUMENTS

| | | | | |
|---|---|---|---|---|
| 6,597,494 B2 * | 7/2003 | Segi et al. | ................... | 359/341.1 |
| 7,268,936 B2 * | 9/2007 | Onaka et al. | ............. | 359/341.41 |
| 2002/0159139 A1 * | 10/2002 | Koplow et al. | ................ | 359/342 |
| 2004/0012844 A1 | 1/2004 | Ohtsuki et al. | | |
| 2004/0246568 A1 * | 12/2004 | Onaka et al. | .................. | 359/337 |
| 2007/0177639 A1 | 8/2007 | Tokuhisa et al. | | |

FOREIGN PATENT DOCUMENTS

| | | |
|---|---|---|
| EP | 1 306 718 A1 | 5/2003 |
| EP | 1 441 454 A2 | 7/2004 |
| EP | 1 750 172 A1 | 2/2007 |
| JP | A 2001-353176 | 12/2001 |
| JP | A 2004-228404 | 8/2004 |
| JP | A 2005-326522 | 11/2005 |

(Continued)

OTHER PUBLICATIONS

Apr. 19, 2010 Supplementary European Search Report issued in European Patent Application No. 07 79 0443.

(Continued)

*Primary Examiner* — Mark Hellner
(74) *Attorney, Agent, or Firm* — Oliff & Berridge, PLC

(57) ABSTRACT

A polarization state adjusting optical element is formed by a ½ wavelength plate and a ¼ wavelength plate and its polarization direction and elliptic degree are adjusted. By adjusting the polarization state adjusting optical element in advance, even if the output of a pump light source is changed, the polarization characteristic (polarization direction and elliptic degree) of the output light of an FDFA amplifier will not change or the change is sufficiently small. In this state, a polarization state adjusting optical element adjusts the polarization state of the laser beam coming into a wavelength conversion optical system so that the wavelength conversion optical system has the maximum conversion efficiency. Thus, it is possible to provide an FDFA having a small change of the polarization state of the output light even if the pump light intensity is changed.

9 Claims, 6 Drawing Sheets

(56) References Cited

FOREIGN PATENT DOCUMENTS

| JP | A 2006-19603 | 1/2006 |
| JP | A 2006-30594 | 2/2006 |
| JP | A 2006-60162 | 3/2006 |
| WO | WO 2004/054050 A1 | 6/2004 |
| WO | WO 2004/086121 A1 | 10/2004 |
| WO | WO 2005/116751 A1 | 12/2005 |

OTHER PUBLICATIONS

Aug. 7, 2007 International Search Report issued in International Patent Application No. PCT/JP2007/063384.

* cited by examiner

OPTICAL FIBER AMPLIFIER, LIGHT SOURCE DEVICE, EXPOSURE DEVICE, OBJECT INSPECTION DEVICE, AND TREATMENT DEVICE

This is a Continuation of application Ser. No. 12/320,055 filed Jan. 15, 2009, which is a Continuation of Application No. PCT/JP2007/063384 filed Jul. 4, 2007, which claims priority of Japanese Patent Application No. 2006-197547 filed Jul. 20, 2006. The disclosure of the prior applications is hereby incorporated by reference herein in its entirety.

TECHNICAL FIELD

The present invention relates to an optical fiber amplifier and a light source device, and an exposure device, an object inspection device, and a processing device using the light source device.

BACKGROUND ART

In recent years, a laser beam has been used for various applications, for example, for cutting or processing a metal, a light source of a photolithography device of a semiconductor manufacturing device, various measuring devices, and operating and treatment devices for surgery, ophthalmology, and dentistry.

When a solid-state laser (cited as a concept including semiconductor laser (or diode laser) in this specification) is used as a laser light source, the wavelength of a laser beam emitted from the solid-state laser is in the visible to infrared region. A method of directly generating an ultraviolet light has not been established. For example, the wavelength is too long to be suitable for use in an inspection device. A method of converting such long-wavelength light emitted from the solid-state laser to a short-wavelength deep ultraviolet light (for example, the eighth harmonic; a wavelength of 193 nm) using a nonlinear optical crystal has been developed and has been described in Japanese Patent Application Laid-Open (JP-A) No. 2001-353176 (Patent Document 1). As nonlinear optical crystals used for such an object, a BBO crystal, an LBO crystal, and a CLBO crystal have been known.

In such laser light source, typically, a laser beam generated from a DFB-LD is amplified using a plurality of optical fiber amplifiers (for example, EDFAs) and is then converted to the deep ultraviolet light by the wavelength conversion optical system.

Patent Document 1: JP-A No. 2001-353176

To maintain the intensity of the output laser beam at a target value, in such a laser light source, feedback control is typically performed. FIG. 7 illustrates the overview of such light source device. An output light from a DFB-LD1 comes into an optical fiber amplifier 3 and is then amplified. The light passes through a polarization state adjusting optical element 4 having a wavelength plate to come into a wavelength conversion optical system 5. The light is wavelength converted to a light having a target wavelength.

The polarization state adjusting optical element 4 adjusts the polarization state of the laser beam coming into the wavelength conversion optical system 5 in such a way that the wavelength conversion optical system 5 has the maximum conversion efficiency. For example, the polarization ellipticity is adjusted by a ¼ wavelength plate. The polarization direction is adjusted by a ½ wavelength plate.

A portion of the output light from the wavelength conversion optical system 5 (for example, the light which has a wavelength of 193 nm and is the eighth harmonic of the light having a wavelength of 1547 nm from the DFB-LD1) is reflected by a partially reflecting mirror 6 and is then taken out as a monitor light. An automatic output controller 7 manipulates an excitation light source (pump light source) 8 which supplies an input to the optical fiber amplifier 3 in such a way that the intensity of the monitor light is kept constant. It has been thought that the intensity of the output light from the wavelength conversion optical system 5 is maintained at a target value by the feedback control system.

Actually, however, a change in the output light from the wavelength conversion optical system 5 for an increase or a decrease in the pump light intensity sometimes greatly differs from that is assumed. This means that the feedback control sometimes does not function sufficiently. In extreme cases, when the output of the pump light is increased, the output of the wavelength conversion optical system 5 is lowered. This means that the feedback control causes divergence.

The present invention has been made in view of such circumstances and can provide an optical fiber amplifier in which even if the intensity of a pump light is changed, a change in the polarization state of an output light is small and the feedback control system can function sufficiently, and a light source device using the same, and an exposure device, an object inspection device, and a processing device using the light source device.

DISCLOSURE OF THE INVENTION

A first means to achieve the above object is an optical fiber amplifier, wherein the polarization state of an input light is adjusted in such a way that the polarization state of an output light will not change even if an amplification factor is changed.

The present inventors have examined in detail the characteristic of the optical fiber amplifier 3 used for such an object to find the followings. When the pump light intensity is changed for the polarization state of the input light in a certain range, the polarization state of the output light is significantly changed according to it. When the polarization state of the output light of the optical fiber amplifier 3 is changed, the polarization state of the input light to the wavelength conversion optical system 5 optimally adjusted by the polarization state adjusting optical element 4 is also changed. As a result, the output of the wavelength conversion optical system 5 is changed due to a cause different from a change in the pump light intensity (a fluctuation of the efficiency of the wavelength conversion optical system due to a change of the polarization state).

As a result of further consideration of the present inventors, the followings have been found. The change of the polarization state (polarization direction and ellipticity) of the output light caused by the amplification factor (the pump light intensity) of the optical fiber amplifier varies depending on the polarization state (polarization direction and ellipticity) of the input light to the optical fiber amplifier. When the polarization state of the input light to the optical fiber amplifier is adjusted, a change of the polarization state of the output light caused by the amplification factor of the optical fiber amplifier will be eliminated or significantly reduced. Accordingly, the polarization state of the input light to the optical fiber amplifier can be adjusted in such a way that a change of the polarization state of the output light caused by the change of the amplification factor of the optical fiber amplifier may be eliminated or significantly reduced.

The description "adjusted in such a way that the polarization state of an output light will not change" means not only the polarization state of the output light will not change at all but also the state of the polarization change is so small that lowering from the optimum value of the wavelength conversion efficiency (the value of the conversion efficiency when the polarization state is in the state optimum for wavelength conversion) can be practically ignored. This is commonly applied to descriptions in the specification and claims.

A second means to achieve the above object is an optical fiber amplifier including a polarization state adjusting optical element which adjusts the polarization state of an input light in such a way that the polarization state of an output light will not change even if an amplification factor is changed.

In this means, the polarization state adjusting optical element having a wavelength plate is provided, for example. By adjusting the element, the polarization state of the input light can be adjusted in such a way that the polarization state of the output light will not change even if the amplification factor of the optical fiber amplifier is changed.

A third means to achieve the above object is a light source device which optically amplifies a laser beam generated from a solid-state laser light source by an optical fiber amplifier or optical fiber amplifiers and allows the optically amplified light to be incident on a wavelength conversion optical system to obtain an output light having a predetermined wavelength, including light separation means for taking out a portion of the output light as a monitor light, and a light intensity adjusting device which manipulates the intensity of an excitation light supplied to at least one of the optical fiber amplifiers in such a way that the intensity of the monitor light taken out by the light separation means is kept at a target value, wherein the optical fiber amplifier which changes an amplification factor by the excitation light whose intensity is manipulated is an optical fiber amplifier of the first means or the second means.

In this means, when the feedback control which allows the output light of the light source device to have the target intensity is performed, the change of the polarization state of the output light of the optical fiber amplifier caused by an increase or a decrease of the excitation light can be small. Thus, the conversion efficiency of the wavelength conversion optical system can be maintained almost constant, and the stable feedback control is enabled.

A fourth means to achieve the above object is a light source device which optically amplifies a laser beam generated from a laser light source by an optical fiber amplifier and allows the optically amplified light to be incident on a wavelength conversion optical system to obtain an output light having a predetermined wavelength, including light separation means for taking out a portion of the output light as a monitor light, and a light intensity adjusting device which manipulates the intensity of an excitation light supplied to the optical fiber amplifier in such a way that the intensity of the monitor light taken out by the light separation means is kept at a target value, wherein a polarization state adjusting optical element is arranged between the laser light source and the optical fiber amplifier.

In a fifth means to achieve the above object according to the fourth means, the polarization state adjusting optical element includes a ¼ wavelength plate and a ½ wavelength plate.

In a sixth means to achieve the above object according to the fourth means, a plurality of the optical fiber amplifiers are provided and the monitor light taken out by the light separation means is supplied to at least one of the plurality of the optical fiber amplifiers.

In a seventh means to achieve the above object according to the fourth means, the polarization state adjusting optical element is arranged between the laser light source and the optical fiber amplifier on which a laser beam emitted from the laser light source is first incident.

An eighth means to achieve the above object is an exposure device including a light source device as the third means or the fourth means, a mask supporting portion which holds a photomask having a predetermined exposure pattern, an object holding portion which holds an exposed object, an illumination optical system which illuminates the photomask held by the mask supporting portion with a light emitted from the light source device, and a projection optical system which projects the light from the photomask onto the exposed object held by the object holding portion.

A ninth means to achieve the above object is an object inspection device including a light source device as the third means or the fourth means, a supporting portion which holds an object, a detector which receives a projection image of the object for detection, an illumination optical system which illuminates the object held by the supporting portion with a light emitted from the light source device, and a projection optical system which projects the light from the object onto the detector.

A tenth means to achieve the above object is a polymer crystal processing device including a light source device as the third means or the fourth means, an optical system which guides a laser beam emitted from the light source device to a polymer crystal as a processed object and focus the laser beam onto the processed location of the polymer crystal, and a mechanism which changes a relative position of the optical system and the polymer crystal.

According to the present invention, it is possible to provide an optical fiber amplifier in which even if the intensity of a pump light is changed, the change of the polarization state of the output light is small and the feedback control system can function sufficiently, and a light source device using the same, and an exposure device, an object inspection device, and a processing device using the light source device.

EXPLANATIONS OF LETTERS OR NUMERALS

Figure 1:
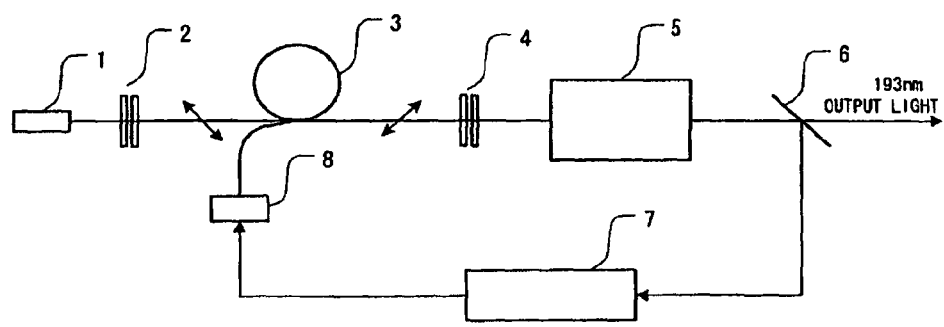
FIG. 1 is a diagram illustrating the overview of an optical fiber amplifier according to an embodiment of the present invention and a light source device using the same.

1 DFB-LD
2 polarization state adjusting optical element, amplifier 3 optical fiber amplifier
4 polarization state adjusting optical element
5 wavelength conversion optical system,
6 partially reflecting mirror
7 automatic output controller
8 excitation light source (pump light source)

BEST MODE FOR CARRYING OUT THE INVENTION

An embodiment of the present invention will be described below using the drawings. FIG. 1 is a diagram illustrating the overview of an optical fiber amplifier according to an embodiment of the present invention and a light source device using the same. An output light from a DFB-LD1 passes through a polarization state adjusting optical element 2 having a wavelength plate. The light comes into an optical fiber amplifier 3 and is then amplified. Then the light passes through a polarization state adjusting optical element 4 having a wavelength plate to come into a wavelength conversion optical system 5. The light is wavelength converted to a light having a target wavelength.

The polarization state adjusting optical element 4 adjusts the polarization state of the laser beam coming into the wavelength conversion optical system 5 in such a way that the wavelength conversion optical system 5 has the maximum conversion efficiency. For example, the polarization ellipticity is adjusted by a ¼ wavelength plate. The polarization direction is adjusted by a ½ wavelength plate.

A portion of the output light from the wavelength conversion optical system 5 (for example, the light which has a wavelength of 193 nm and which is the eighth harmonic of the light having a wavelength of 1547 nm from the DFB-LD1) is reflected by a partially reflecting mirror 6 and is then taken out as a monitor light. An automatic output controller 7 manipulates an excitation light source (pump light source) 8 which supplies an input to the optical fiber amplifier 3 in such a way that the intensity of the monitor light is kept constant. The intensity of the output light from the wavelength conversion optical system 5 is maintained at a target value by the feedback control system.

Figure 7:
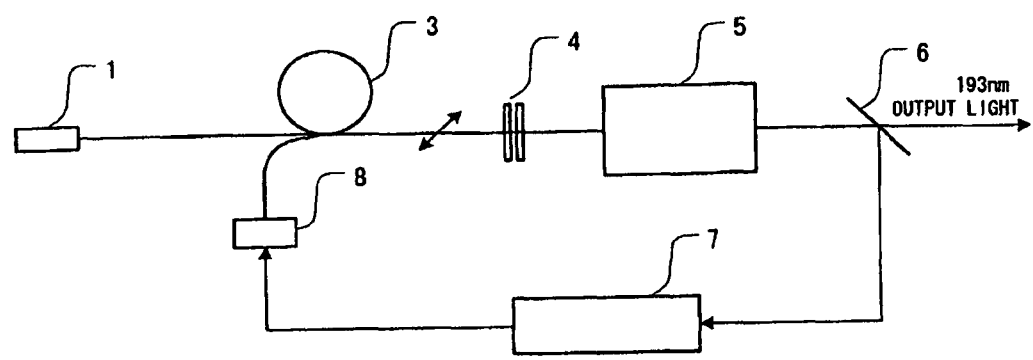
FIG. 7 is a diagram illustrating the overview of a laser light source device in the related art.

This embodiment is compared with the light source circuit in the related art illustrated in FIG. 7. In this embodiment, the polarization state adjusting optical element 2 is provided. The polarization state adjusting optical element 2 has a ½ wavelength plate and a ¼ wavelength plate and adjusts the polarization direction and ellipticity. By adjusting the polarization state adjusting optical element 2 in advance, even if the output of the excitation light source (pump light source) 8 is changed, the polarization characteristic (polarization direction and ellipticity) of the output light of the optical fiber amplifier 3 will not change or the change is sufficiently small. In this state, the polarization state adjusting optical element 4 adjusts the polarization state of the laser beam coming into the wavelength conversion optical system 5 in such a way that the wavelength conversion optical system 5 has the maximum conversion efficiency. Even if the output of the excitation light source (pump light source) 8 is changed, the conversion efficiency of the wavelength conversion optical system 5 is maintained in the state close to the maximum, and the feedback control is made stable.

Figure 2:
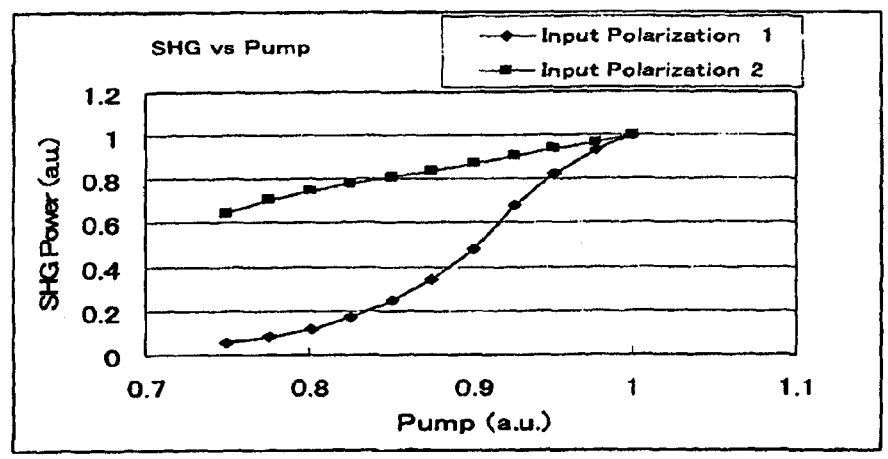
FIG. 2 is a diagram illustrating intensity of an excitation light (pump light) and intensity of an output light of a wavelength conversion optical system 5 when the polarization state of a light coming into the optical fiber amplifier is not adjusted and when the polarization state of the light coming into the optical fiber amplifier 3 is adjusted by a method of the present invention.

FIG. 2 illustrates the intensity of an excitation light (pump light) (the normalized value on the horizontal axis) and the intensity of the second harmonic of the wavelength conversion optical system 5 (the normalized value on the vertical axis) when the polarization state of a light coming into the optical fiber amplifier 3 is not adjusted (Input Polarization 1) and when the polarization state of the light coming into the optical fiber amplifier 3 is adjusted by a method of the present invention (Input Polarization 2).

When the polarization state of the input light is not adjusted, the rate of a change in the intensity of the second harmonic of the wavelength conversion optical system 5 due to a change in the intensity of the excitation light (pump light) is large. Although not illustrated, when the intensity of the excitation light (pump light) is increased and exceeds 1, the intensity of the output light of the wavelength conversion optical system 5 can be lowered. This means that with a change in the intensity of the excitation light (pump light), the polarization state of the output of the optical fiber amplifier is greatly changed and that the conversion efficiency of the wavelength conversion optical system 5 is greatly deviated from the optimum value.

When the polarization state of the light coming into the optical fiber amplifier 3 is adjusted by the method of the present invention, it is found that a change in the intensity of the output light of the wavelength conversion optical system 5 with respect to a change in the intensity of the excitation light (pump light) is smaller and the system is made more stable. This means that the polarization state of the output light from the optical fiber amplifier is hardly changed with a change in the excitation light (pump light) intensity and that the conversion efficiency of the wavelength conversion optical system 5 is maintained at the optimum value.

The light can be amplified by a plurality of optical fiber amplifiers before coming into the wavelength conversion optical system 5. In this case, the polarization state adjusting optical element 2 may be provided before the first-stage optical fiber amplifier of the optical fiber amplifiers of which the pump light is changed and be adjusted in such a way that the polarization state of the output light of the last-stage optical fiber amplifier will not change or the change will be minimized.

Various configurations of the wavelength conversion optical system 5 can be considered and have been known. An example is described in Patent Document 1 and the illustration and description thereon are omitted.

Figure 3:
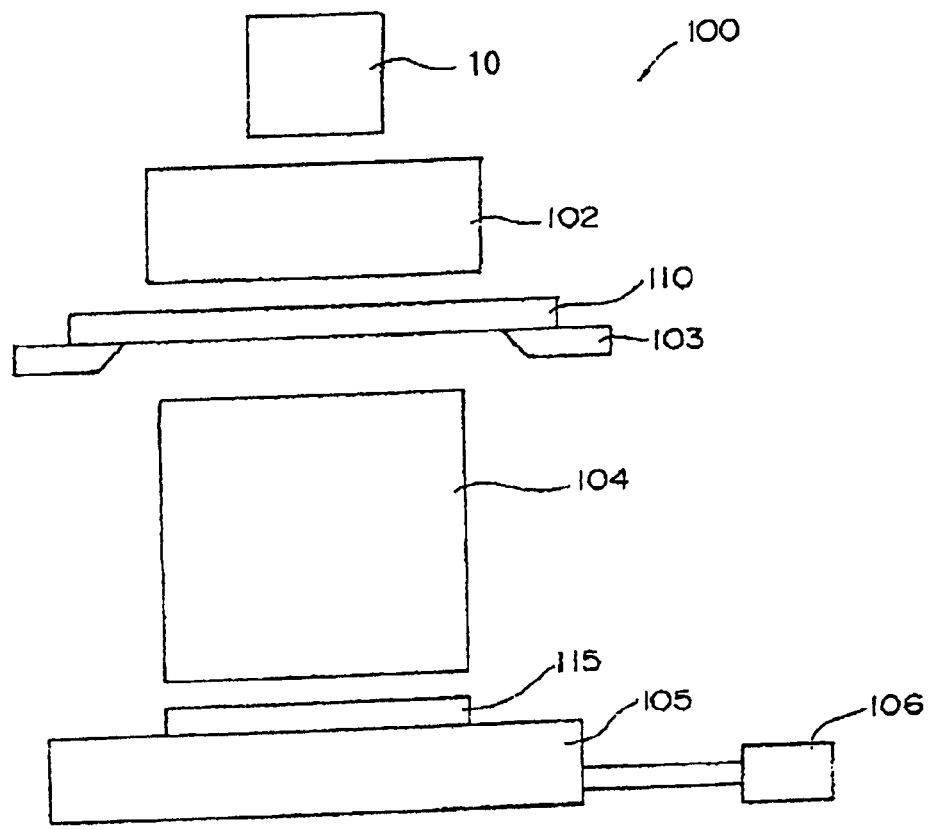
FIG. 3 is a diagram illustrating the overview of an exposure device using the light source device according to an embodiment of the present invention.

With reference to FIG. 3, an exposure device 100 which is configured using a light source device 10 according to an embodiment of the present invention and is used in the photolithography process as one of the semiconductor manufacturing processes will be described. In principle, the exposure device used in the photolithography process is the same as photoengraving. A device pattern precisely plotted on a photomask (reticle) is optically projected and transferred onto a semiconductor wafer or a glass substrate onto which a photoresist is applied.

The exposure device 100 has the light source device 10, an illumination optical system 102, a mask supporting base 103 which supports a photomask (reticle) 110, a projection optical system 104, a placing base 105 which places and holds a semiconductor wafer 115 as an exposed object, and a driving device 106 which horizontally moves the placing base 105. In the exposure device 100, a laser beam output from the light source device 10 is input to the illumination optical system 102 having a plurality of lenses and then passes therethrough to illuminate the entire surface of the photomask 110 supported by the mask supporting base 103. The light which has illuminated and passed through the photomask 110 has an image of the device pattern plotted on the photomask 110. The light illuminates a predetermined position of the semiconductor wafer 115 placed on the placing base 105 via the projection optical system 104.

The image of the device pattern of the photomask 110 becomes smaller and is then focused on the semiconductor wafer 115 by the projection optical system 104 for exposure. According to the exposure device, features of the ultraviolet light source including compactness, lightweight, and a high degree of freedom in arrangement are exploited to obtain the exposure device which is compact and easy to maintain and operate.

Figure 4:
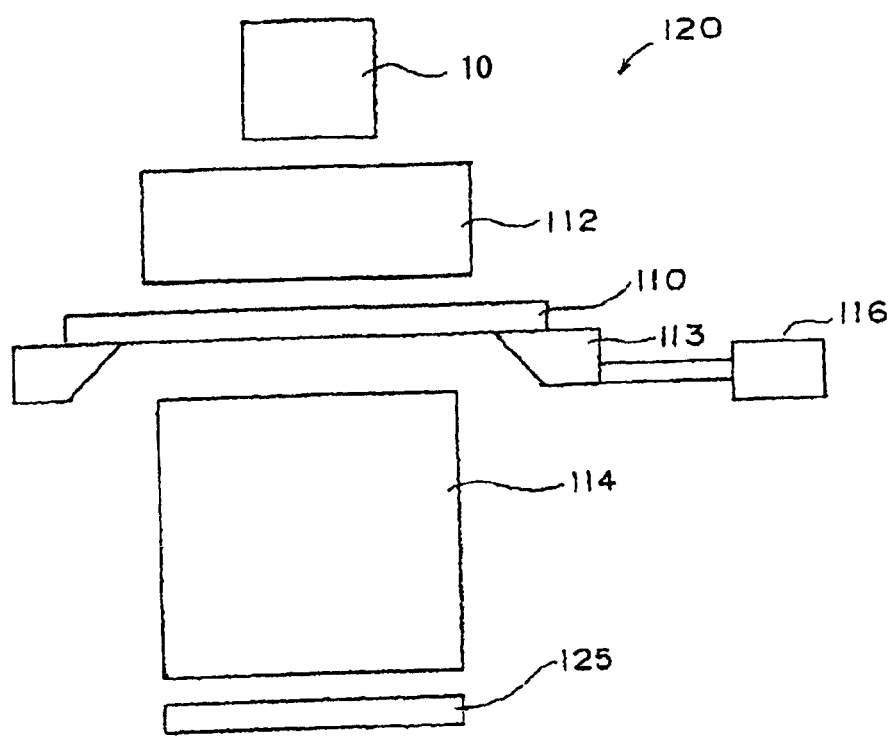
FIG. 4 is a diagram illustrating the overview of a mask defect inspection device using the light source device according to an embodiment of the present invention.

A mask defect inspection device configured using the light source device 10 according to the present invention will be described below with reference to FIG. 4. The mask defect inspection device optically projects a device pattern precisely plotted on the photomask onto a TDI sensor (Time Delay and Integration), compares a sensor image with a predetermined reference image, and extracts a defect of the pattern from the difference. A mask defect inspection device 120 has the light source device 10, an illumination optical system 112, a mask supporting base 113 which supports the photomask 110, a driving device 116 which horizontally moves the mask supporting base, a projection optical system 114, and a TDI sensor 125.

In the mask defect inspection device 120, a laser beam output from the light source device 10 is input to the illumination optical system 112 having a plurality of lenses, and then passes therethrough to illuminate a predetermined region of the photomask 110 supported by the mask supporting base 113. The light which has illuminated and passed through the photomask 110 has an image of the device pattern plotted on the photomask 110. The light is focused onto a predetermined position of the TDI sensor 125 via the projection optical system 114.

The horizontal moving speed of the mask supporting base 113 is synchronized with the transfer clock of the TDI 125. The object is not limited to a mask and the device is used also for inspecting a wafer and a liquid crystal panel.

Figure 5:
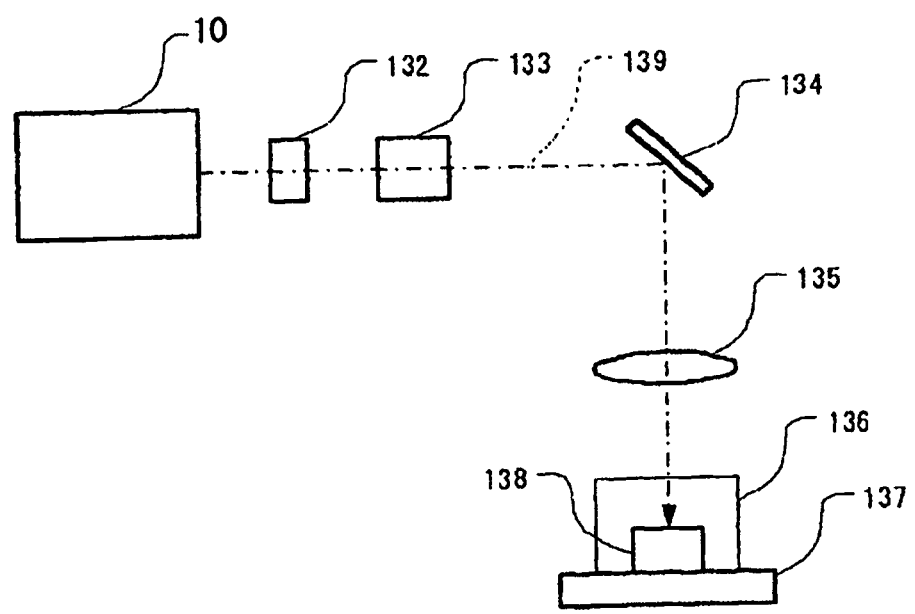
FIG. 5 is a diagram illustrating the overview of a polymer crystal processing device using the light source device according to an embodiment of the present invention.

FIG. 5 is a diagram illustrating the overview of a polymer crystal processing device using the light source device 10 of the present invention.

An ultraviolet short pulse laser beam 139 emitted from the light source device 10 is focused on and illuminates a polymer crystal 138 placed in a specimen case 136 via a shutter 132, an intensity adjusting element 133, an illumination position control mechanism 134, and a focusing optical system 135. The specimen case 136 is mounted on a stage 137, is movable in three dimensional directions of the x axis, the y axis, and the z axis in the x-y-z orthogonal coordinate system, with the optical axis direction as the z axis, and is rotatable about the z axis. The polymer crystal is processed by the laser beam which is focused on and illuminates the surface of the polymer crystal 138.

When a processed object of a polymer crystal is processed, it is necessary to check where in the processed object the laser beam illuminates. In many cases, typically, the laser beam is not a visible light and cannot be visually observed. Accordingly, it is preferable to combine the processing device with an optical microscope.

Figure 6:
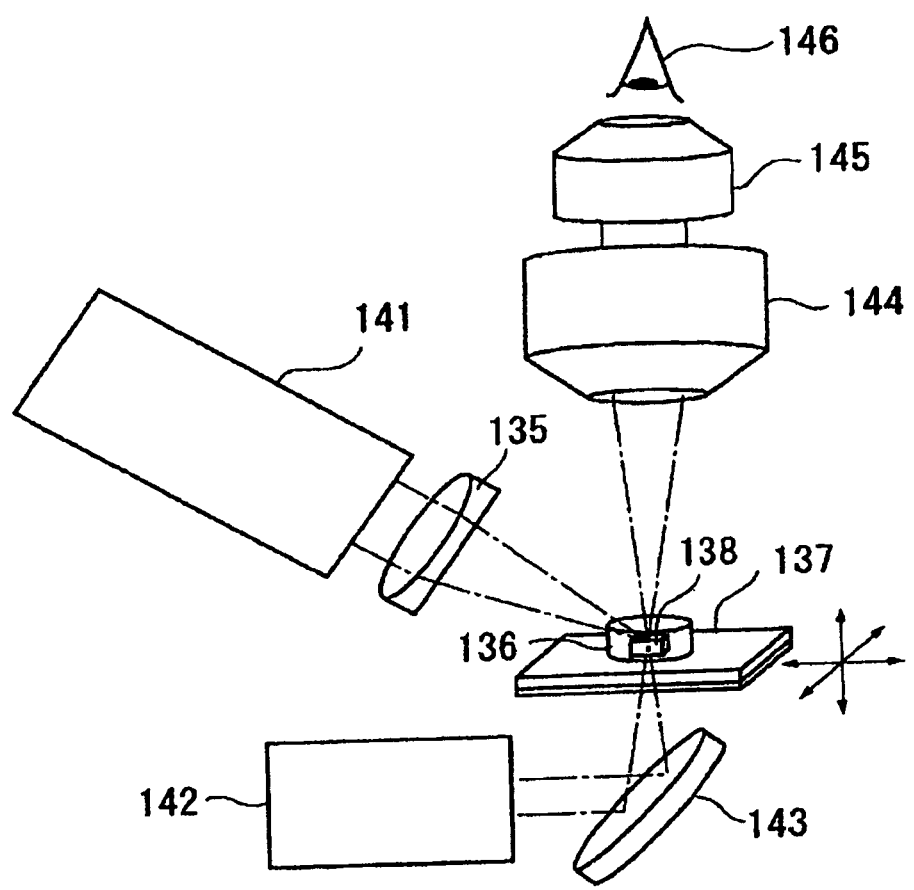
FIG. 6 is a diagram illustrating an example in which the polymer crystal processing device using the light source device according to an embodiment of the present invention is combined with an optical microscope.

An example is illustrated in FIG. 6. In the optical system illustrated in FIG. 6, a laser beam from an ultraviolet short pulse laser system 141 (corresponding to the reference numerals 10 and 132 to 134 in FIG. 5) is focused on a predetermined point via the focusing optical system 135. The stage 137 has the function described in FIG. 6. The specimen case 136 including the polymer crystal 138 is placed on the stage 137. The visible light from an illumination light source 142 is reflected by a reflection mirror 143 to Koehler illuminate the specimen case 136. The polymer crystal 138 is visually observed by eyes 146 via an objective lens 144 and an eyepiece 145 of the optical microscope. A cross mark is formed in the optical axis position of the optical microscope, and the optical axis position can be visually observed.

The focal position of the optical microscope (the focusing position, that is, an object plane which is in focus at visual observation) is fixed. The laser beam focused by the focusing optical system 135 is focused on the optical axis position and the focal position of the optical microscope. The processed object is placed on the stage 137 to observe its image by the optical microscope. The laser beam from the laser system 141 is focused on the position which is in focus and is the center of the cross mark. A relative positional relationship between the laser system 141, the focusing optical system 135, and the optical microscope is fixed. Only the stage 137 can be moved relatively to the fixed system.

Accordingly, processing is performed by moving the stage 137 in such a way that the location to be processed is the optical axis position and the focusing position of the optical microscope. As a result, the processing in a desired location and a desired shape can be performed. If processing is to be automatically performed, an automatic focal point adjusting device is provided in the optical microscope to drive the stage 137 by its instruction, and the stage 137 may be driven in such a way that a predetermined portion of the stage 137 is on the optical axis of the optical microscope. Alternatively, after alignment of a reference position, the stage 137 may be driven in two dimensions or three dimensions by a servomechanism.

The invention claimed is:

1. A light source device comprising:
    a laser light source for providing input light;
    an optical fiber amplifier for amplifying the input light and thus generating amplified light;
    a polarization state adjusting optical element arranged between the laser light source and the optical fiber amplifier; and
    a pump light source for providing pump light to the optical fiber amplifier, the amplification factor of the optical fiber amplifier depending on the pump light intensity,
    characterized in that the polarization state adjusting optical element is configured to adjust the polarization state of the input light to a polarization state for which the change of the polarization state of the amplified light with a change of the pump light intensity is minimized.

2. The light source device according to claim 1, further comprising:
    a wavelength conversion optical system for wavelength converting the amplified light and thus generating output light having a predetermined wavelength;
    a light separation element for taking out a portion of the output light as a monitor light; and
    a light intensity adjusting device for manipulating the intensity of the pump light supplied to the optical fiber amplifier in such a way that the intensity of the monitor light taken out by the light separation element is kept at a target value.

3. The light source device according to claim 2, wherein a plurality of optical fiber amplifiers are provided for amplifying the input light and thus generating the amplified light, and wherein the light intensity adjusting device is configured to manipulate the intensity of the pump light supplied to at least one of the optical fiber amplifiers in such a way that the intensity of the monitor light taken out by the light separation element is kept at the target value.

4. The light source device according to claim 3, wherein the polarization state adjusting optical element has a ¼ wavelength plate and a ½ wavelength plate.

5. The light source device according to claim 3, wherein the monitor light taken out by the light separation element is supplied to at least one of the plurality of the optical fiber amplifiers.

6. The light source device according to claim 3, wherein the polarization state adjusting optical element is arranged between the laser light source and the optical fiber amplifier on which a laser beam emitted from the laser light source is first incident.

7. An exposure device comprising:
   a light source device according to claim 3;
   a mask supporting portion for holding a photomask having a predetermined exposure pattern;
   an object holding portion for holding an object that is to be exposed;
   an illumination optical system for illuminating the photomask held by the mask supporting portion with a light emitted from the light source device; and
   a projection optical system for projecting the light from the photomask onto the object held by the object holding portion.

8. An object inspection device comprising:
   a light source device according to claim 3;
   a supporting portion for holding an object;
   a detector for receiving a projection image of the object for detection;
   an illumination optical system for illuminating the object held by the supporting portion with a light emitted from the light source device; and
   a projection optical system for projecting the light from the object onto the detector.

9. A polymer crystal processing device comprising:
   a light source device according to claim 3;
   an optical system for guiding a laser beam emitted from the light source device to a polymer crystal as a processed object and focusing the laser beam onto a processed location of the polymer crystal; and
   a mechanism which changes a relative position of the optical system and the polymer crystal.

\* \* \* \* \*